US012701995B2

(12) United States Patent
Liao et al.

(10) Patent No.: US 12,701,995 B2
(45) Date of Patent: Aug. 4, 2026

(54) BACK END OF LINE RESISTOR STRUCTURE

(71) Applicant: Taiwan Semiconductor Manufacturing Company, Ltd., Hsinchu (TW)

(72) Inventors: Shih-Yu Liao, Hsinchu City (TW); Chung-Liang Cheng, Changhua (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 360 days.

(21) Appl. No.: 18/515,521

(22) Filed: Nov. 21, 2023

(65) Prior Publication Data

US 2025/0096120 A1 Mar. 20, 2025

Related U.S. Application Data

(60) Provisional application No. 63/582,909, filed on Sep. 15, 2023.

(51) Int. Cl.
| | |
|---|---|
| *H10W 20/40* | (2026.01) |
| *H10D 1/47* | (2025.01) |
| *H10W 20/00* | (2026.01) |
| *H10W 20/43* | (2026.01) |

(52) U.S. Cl.
CPC ............ *H10W 20/498* (2026.01); *H10D 1/47* (2025.01); *H10W 20/01* (2026.01); *H10W 20/43* (2026.01)

(58) Field of Classification Search
CPC ...... H10D 1/47; H10W 20/498; H10W 20/01; H10W 20/43
See application file for complete search history.

(56) References Cited

U.S. PATENT DOCUMENTS

| | | | |
|---|---|---|---|
| 2003/0222295 A1* | 12/2003 | Lin | H01L 23/522 257/E21.582 |
| 2004/0016948 A1* | 1/2004 | Lin | H01L 23/522 257/E21.582 |
| 2004/0029404 A1* | 2/2004 | Lin | H01L 23/522 257/E21.582 |
| 2005/0184358 A1* | 8/2005 | Lin | H10D 1/20 257/E21.582 |
| 2005/0263850 A1 | 12/2005 | Aitken et al. | |

(Continued)

FOREIGN PATENT DOCUMENTS

KR 1020200029326 A 3/2020

*Primary Examiner* — Jeff W Natalini
*Assistant Examiner* — Rose Keagy
(74) *Attorney, Agent, or Firm* — Sterne, Kessler, Goldstein & Fox P.L.L.C.

(57) ABSTRACT

The present disclosure describes a resistor structure with a dielectric layer, trenches, a metal layer, a semiconductor layer, and an insulating layer. The dielectric layer is disposed above electrical components formed on a substrate. The trenches are disposed in the dielectric layer and separated from each other by a dielectric region of the dielectric layer. The metal layer is disposed on a bottom surface and side surfaces of each of the trenches and on a top surface of the dielectric region. The semiconductor layer is disposed on a bottom surface, side surfaces, and a top surface of the metal layer. The insulating layer is disposed in the trenches and in contact with side surfaces of the semiconductor layer and on a top surface of the semiconductor layer.

20 Claims, 14 Drawing Sheets

(56) References Cited

U.S. PATENT DOCUMENTS

| 2008/0111243 A1* | 5/2008 | Lin | H10D 1/20 |
| | | | 257/E23.141 |
| 2015/0311272 A1* | 10/2015 | Romanescu | H10D 1/474 |
| | | | 257/379 |
| 2017/0330873 A1 | 11/2017 | Tamura et al. | |
| 2020/0176380 A1 | 6/2020 | Chen et al. | |
| 2021/0184111 A1 | 6/2021 | Chiang et al. | |
| 2022/0271116 A1* | 8/2022 | Adusumilli | H10D 84/817 |
| 2022/0328346 A1 | 10/2022 | Lai et al. | |

* cited by examiner

500

510 Form interlayer dielectric structure above electrical components

520 Form trenches in interlayer dielectric structure

530 Form metal layer on inner surfaces of trenches

540 Form semiconductor layer on metal layer

550 Form insulating layer in trenches

560 Form interconnect structures

135

432

135

BACK END OF LINE RESISTOR STRUCTURE

CROSS-REFERENCE TO RELATED APPLICATION

This application claims the benefit of U.S. Provisional Patent Application No. 63/582,909, titled "Deep Trench Resistor and Method for Forming the Same," which was filed on Sep. 15, 2023 and is incorporated herein by reference in its entirety.

BACKGROUND

With advances in semiconductor technology, there have been increasing demands for higher storage capacity, faster processing systems, higher performance, and lower costs. To meet these demands, the semiconductor industry continues to scale down the dimensions of circuit elements, such as active devices (e.g., planar metal-oxide-semiconductor field-effect transistors (MOSFETs), fin field-effect transistors (finFETs), and gate-all-around field-effect transistors (GAAFETs)) and passive devices (e.g., capacitors, inductors, and resistors). As the number of circuit elements increases, implementation of these circuit elements becomes increasingly more complex.

BRIEF DESCRIPTION OF THE DRAWINGS

Aspects of the present disclosure are best understood from the following detailed description when read with the accompanying figures. It is noted that, according to the standard practice in the industry, various features are not drawn to scale. In fact, the dimensions of the various features may be arbitrarily increased or reduced for clarity of discussion.

FIGS. 6A-14A and 6B-14B are illustrations of top-level and cross-sectional views of a deep trench resistor in a back end of line region of a semiconductor device at various stages of fabrication, according to some embodiments of the present disclosure.

DETAILED DESCRIPTION

Figure 1:
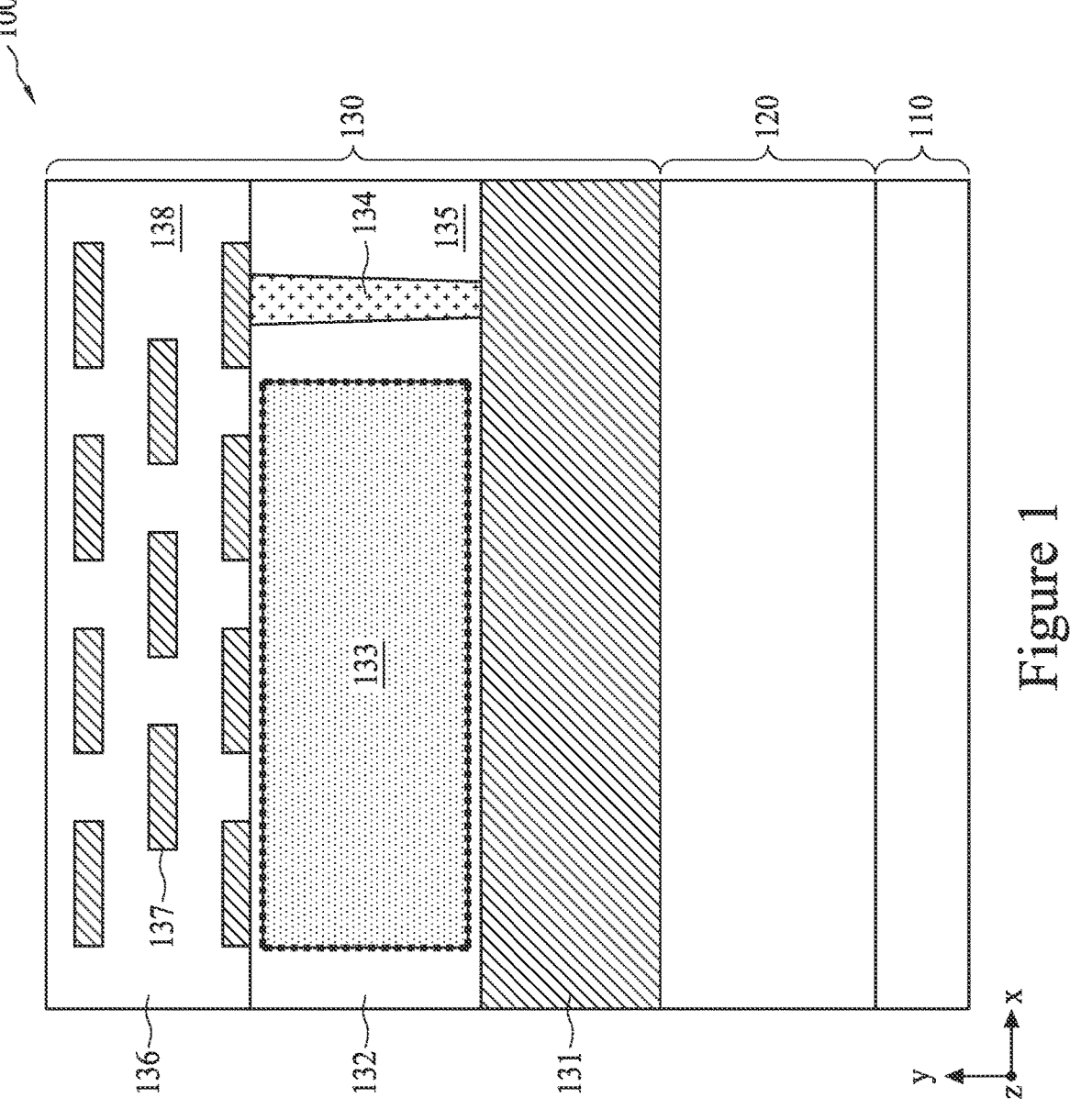
FIG. 1 is an illustration of a cross-sectional view of a semiconductor device, according to some embodiments of the present disclosure.

The following disclosure provides many different embodiments, or examples, for implementing different features of the provided subject matter. Specific examples of components and arrangements are described below to simplify the present disclosure. These are merely examples and are not intended to be limiting. In addition, the present disclosure repeats reference numerals and/or letters in the various examples. This repetition is for the purpose of simplicity and clarity and, unless indicated otherwise, does not in itself dictate a relationship between the various embodiments and/or configurations discussed. Spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

In some embodiments of the present disclosure, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

With advances in semiconductor technology, there have been increasing demands for higher storage capacity, faster processing systems, higher performance, and lower costs. To meet these demands, the semiconductor industry continues to scale down the dimensions of circuit elements, such as active devices (e.g., MOSFETs, finFETs, and GAAFETs) and passive devices (e.g., capacitors, inductors, and resistors). As the number of circuit elements increases, implementation of these circuit elements becomes increasingly more complex.

The present disclosure describes semiconductor structures and methods to form resistor structures in a back end of line region of a semiconductor device (e.g., interconnect structures disposed above a substrate of the semiconductor device). The resistor structure can include a dielectric layer, trenches, a metal layer, a semiconductor layer, and an insulating layer. The dielectric layer is disposed above electrical components formed on a substrate. The trenches are disposed in the dielectric layer and separated from each other by a dielectric region of the dielectric layer. The metal layer is disposed on a bottom surface and side surfaces of each of the trenches and on a top surface of the dielectric region. The semiconductor layer is disposed on a bottom surface, side surfaces, and a top surface of the metal layer. The insulating layer disposed in the plurality of trenches and in contact with side surfaces of the semiconductor layer and on a top surface of the semiconductor layer. A benefit, among others, of implementing the resistor structure in the back end of line region of the semiconductor device is that that the back end of line region can be utilized for the fabrication of passive devices—e.g., resistor structures—thus increasing available area on the substrate for the implementation of additional active devices and/or passive devices to enhance the functionality and performance of the semiconductor device.

FIG. 1 is an illustration of a cross-sectional view of a semiconductor device 100, according to some embodiments of the present disclosure. Semiconductor device 100 can be a central processing unit, a graphics processing unit, an application-specific integrated circuit, or any other suitable electronic device. In some embodiments of the present disclosure, semiconductor device 100 can include a substrate 110, a device region 120, and a back end of line region 130.

Substrate 110 can include a semiconductor material, such as crystalline silicon (Si). In some embodiments of the present disclosure, substrate 110 can include (i) an elementary semiconductor, such as germanium (Ge); (ii) a compound semiconductor, such as silicon carbide (SiC), silicon arsenide (SiAs), gallium arsenide (GaAs), gallium phosphide (GaP), and/or a III-V semiconductor material; (iii) an alloy semiconductor, such as silicon germanium (SiGe), silicon germanium carbide (SiGeC), germanium tin (GeSn), and/or aluminum gallium arsenide (AlGaAs); (iv) a silicon-on-insulator (SOI) structure; (v) a silicon germanium (SiGe)-on insulator structure (SiGeOI); (vi) a germanium-on-insulator (GeOI) structure; or (vii) a combination thereof. Alternatively, substrate 110 can be made from an electrically non-conductive material, such as glass and a sapphire wafer. Further, substrate 110 can be doped depending on design requirements (e.g., p-type substrate or n-type substrate). In some embodiments of the present disclosure, substrate 110 can be doped with p-type dopants (e.g., boron, indium, aluminum, or gallium) or n-type dopants (e.g., phosphorus or arsenic).

Device region 120 can be disposed on substrate 110. In some embodiments of the present disclosure, device region 120 can include electrical components, such as active devices, passive devices, or a combination thereof. Examples of the active devices can include planar MOS-FETs, finFETs, GAAFETs, and nanostructure transistors (e.g., nanosheet transistors, nanowire transistors, multi-bridge channel transistors, and nano-ribbon transistors). Device region 120 can include one or more of these different types of active devices, which can be separated from one another using shallow trench isolation, deep trench isolation, local oxidation of silicon, any other suitable isolation technique, or a combination thereof. Examples of the passive devices can include resistors, capacitors, and inductors. Device region 120 can also include one or more of these different types of passive devices. In some embodiments of the present disclosure, a combination of the active devices and the passive devices in device region 120 can form one or more electronic circuits, such as a central processing unit, a graphics processing unit, an application-specific integrated circuit, any other suitable electronic circuit, and portions thereof.

Referring to FIG. 1, back end of line region 130 is disposed above device region 120 (e.g., in a y direction) and can include a first interconnect region 131, a second interconnect region 132, and a third interconnect region 136, according to some embodiments of the present disclosure. First interconnect region 131 can include one or more interconnect structures—e.g., metal line structures and metal via structures—disposed in an interlayer dielectric structure (not shown in FIG. 1). The metal line structures and metal via structures can include copper (Cu), aluminum (Al), titanium nitride (TiN), tantalum nitride (TaN), tungsten (W), or any other suitable conductive material. The interlayer dielectric structure can include a dielectric material, such as silicon oxide (SiOx), silicon hydroxide (SiOH), silicon oxynitride (SiON), silicon nitride (SiNx), silicon oxycarbide (SiOC), silicon oxynitricarbide (SiOCN), and a combination thereof. The interlayer dielectric structure can include a stack of dielectric layers to implement multiple layers of interconnect structures. The one or more interconnect structures in first interconnect region 131 can electrically connect to the electrical components in device region 120 (e.g., active devices, passive devices, or a combination thereof).

Referring to FIG. 1, second interconnect region 132 is above first interconnect region 131 (e.g., in a y direction) and can include a passive device region 133 and a metal via structure 134—both disposed in an interlayer dielectric structure 135—according to some embodiments of the present disclosure. Metal via structure 134 can electrically connect interconnect structures in first interconnect region 131 to interconnect structures in third interconnect region 136. Although not shown in FIG. 1, second interconnect region 132 can also include metal line structures and other metal via structures. The metal line structures and metal via structures (including metal via structure 134) can include Cu, Al, TiN, TaN, W, or any other suitable conductive material. Interlayer dielectric structure 135 can include a dielectric material, such as SiOx, SiOH, SiON, SiNx, SiOC, SiOCN, and a combination thereof. Interlayer dielectric structure 135 can include a stack of dielectric layers to implement multiple layers of interconnect structures.

In some embodiments of the present disclosure, passive device region 133 can include one or more resistor structures. The one or more resistor structures can each be a deep trench resistor, according to some embodiments of the present disclosure. A benefit, among others, of implementing resistor structures in passive device region 133 is that back end of line region 130 can be utilized for the fabrication of passive devices—e.g., resistor structures—thus increasing available area in device region 120 for the implementation of additional active devices and/or passive devices to enhance the functionality and performance of semiconductor device 100. Though the description below is in the context of resistor structures (e.g., deep trench resistors), other types of passive devices (e.g., capacitor structures and inductor structures) can be implemented in passive device region 133.

Referring to FIG. 1, third interconnect region 136 is above second interconnect region 132 (e.g., in a y direction) and can include one or more interconnect structures disposed in an interlayer dielectric structure 138. The interconnect structures can include metal line structures 137 and metal via structures (not shown in FIG. 1). The metal line structures and metal via structures can include Cu, Al, TiN, TaN, W, or any other suitable conductive material. The interconnect structures in third interconnect region 136 can electrically connect to the electrical components in device region 120 through metal via structure 134 (and other metal via structures not shown in FIG. 1) and interconnect structures in first interconnect region 131. Interlayer dielectric structure 138 can include a dielectric material, such as SiOx, SiOH, SiON, SiNx, SiOC, SiOCN, and a combination thereof. Interlayer dielectric structure 138 can include a stack of dielectric layers to implement multiple layers of interconnect structures. Although three layers of metal line structures 137 are shown in third interconnect region 136, third interconnect region 136 can have more or less than three layers of metal line structures, depending on the design of semiconductor device 100.

Figure 2:
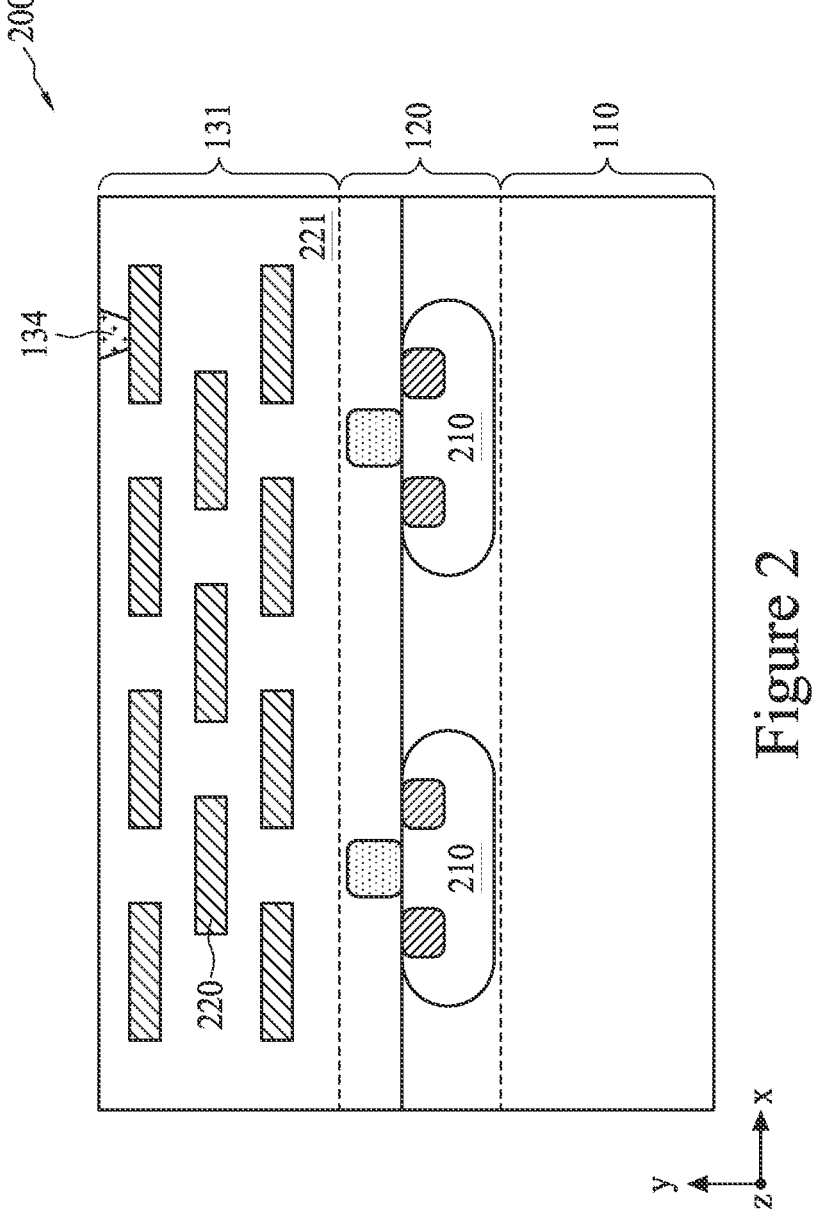
FIG. 2 is an illustration of a cross-sectional view of a portion of a semiconductor device, according to some embodiments of the present disclosure.

FIG. 2 is an illustration of a cross-sectional view of a portion 200 of semiconductor device 100, according to some embodiments of the present disclosure. Portion 200 includes substrate 110, device region 120, and first interconnect region 131. Although not shown in FIG. 2, second interconnect region 132 and third interconnect region 136 are disposed above first interconnect region 131 as shown in FIG. 1.

Device region 120 can include active devices 210 implemented within and/or on substrate 110. Active devices 210 can include one or more of MOSFETs, finFETs, GAAFETs, and nanostructure transistors (e.g., nanosheet transistors, nanowire transistors, multi-bridge channel transistors, and nano-ribbon transistors), according to some embodiments of the present disclosure. Active devices 210 can be separated from one another using shallow trench isolation, deep trench isolation, local oxidation of silicon, other suitable isolation techniques, or a combination thereof. In some embodiments of the present disclosure, active devices 210 can represent portions of a central processing unit, a graphics processing unit, an application-specific integrated circuit, or any other suitable electronic device. Further, although not shown in FIG. 2, device region 120 can also include passive devices (e.g., resistors, capacitors, and inductors) implemented within and/or on substrate 110.

In some embodiments of the present disclosure, first interconnect region 131 can include interconnect structures—e.g., metal line structures 220 and metal via structure 134—disposed in interlayer dielectric structure 221. Metal line structures 220 and metal via structure 134 can electrically connect to the active devices and/or the passive devices in device region 120 (e.g., active devices 210) such that these electrical components can electrically connect to one another and/or to upper interconnect structures (e.g., interconnect structures in second interconnect region 132 and in third interconnect region 136—not shown in FIG. 2). Although not shown in FIG. 2, first interconnect region 131 can also include other metal via structures. The metal line structures and metal via structures (including metal via structure 134) can include Cu, Al, TiN, TaN, W, or any other suitable conductive material. Interlayer dielectric structure 221 can include a dielectric material, such as SiO$_x$, SiOH, SiON, SiN$_x$, SiOC, SiOCN, and a combination thereof. Interlayer dielectric structure 221 can include a stack of dielectric layers to implement multiple layers of interconnect structures.

Figure 3:
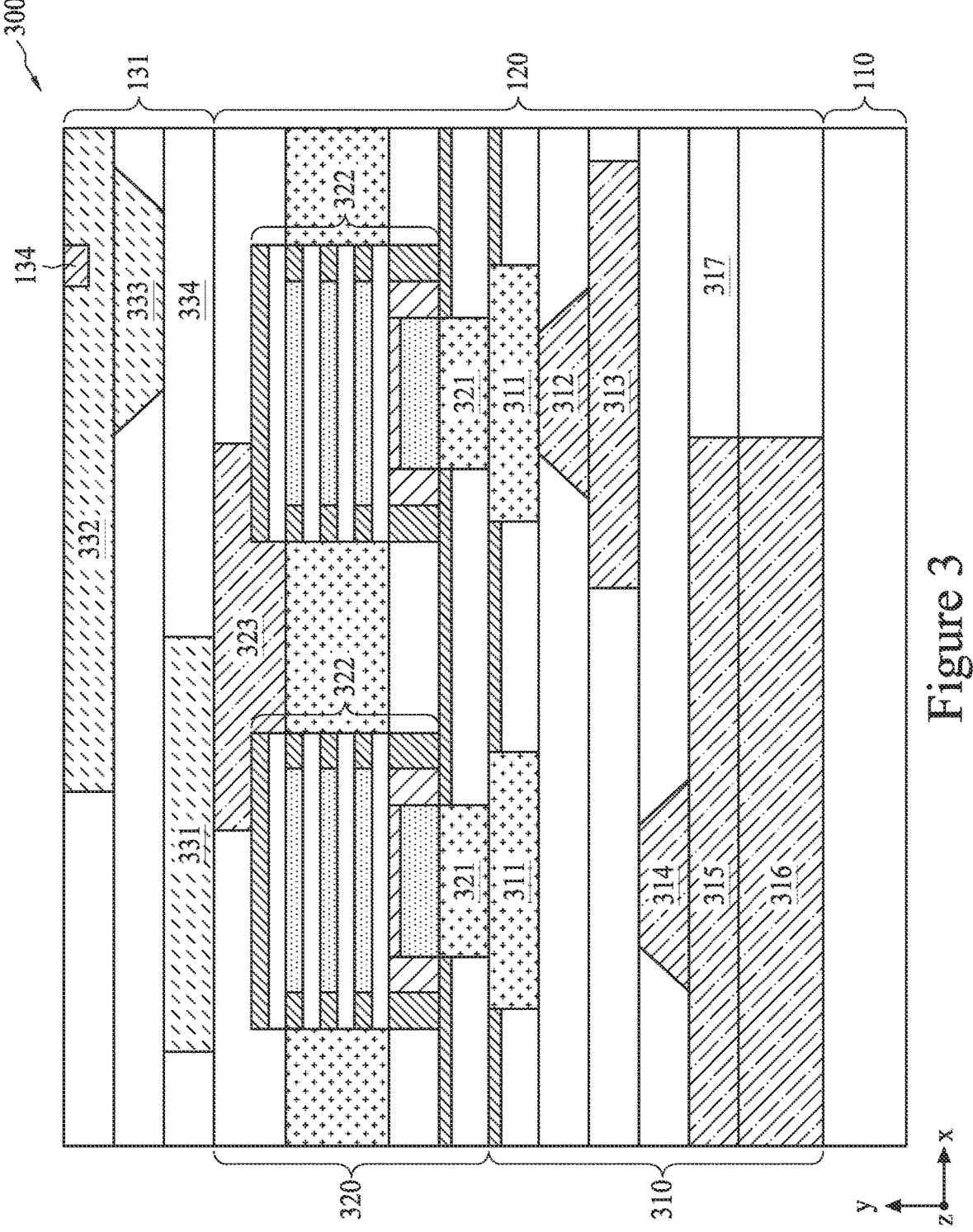
FIG. 3 is an illustration of another cross-sectional view of a portion of a semiconductor device, according to some embodiments of the present disclosure.

FIG. 3 is an illustration of another cross-sectional view of a portion 300 of semiconductor device 100, according to some embodiments of the present disclosure. Although not shown in FIG. 3, second interconnect region 132 and third interconnect region 136 are disposed above first interconnect region 131 as shown in FIG. 1, according to some embodiments of the present disclosure.

Portion 300 includes substrate 110, device region 120, and first interconnect region 131. Device region 120 can include a backside interconnect region 310 and device region 320, according to some embodiments of the present disclosure. In some embodiments of the present disclosure, backside interconnect region 310 is below device region 120 (e.g., in a y direction). Backside interconnect region 310 can include interconnect structures (e.g., as part of a redistribution layer network of interconnect routings) disposed in an interlayer dielectric structure 317 and arranged to provide a power supply voltage to electrical components in device region 320. Interlayer dielectric structure 317 can include a dielectric material, such as SiO$_x$, SiOH, SiON, SiN$_x$, SiOC, SiOCN, and a combination thereof. Interlayer dielectric structure 317 can include a stack of dielectric layers to implement multiple layers of interconnect structures. Further, the interconnect structures can include metal line structures 311, 313, 315, and 316 and metal via structures 312 and 314 electrically connected to one another and to a power supply source to provide a power supply voltage to device region 320. Metal line structures 311, 313, 315, and 316 and metal via structures 312 and 314 can include Cu, Al, TiN, TaN, W, or any other suitable conductive material.

Device region 120 can include active devices 322 disposed above substrate 110 (e.g., in a y direction), according to some embodiments of the present disclosure. In some embodiments of the present disclosure, as shown in FIG. 3, active devices 322 can be GAAFETs electrically connected to backside interconnect region 310 and to first interconnect region 131 through metal contact structures 321 and metal contact structure 323, respectively. In some embodiments of the present disclosure, active devices 322 can receive—through metal contact structures 321—a power supply voltage from the interconnect structures in backside interconnect region 310. Further, in some embodiments of the present disclosure, active devices 322 can receive—through metal contact structure 323—a gate control voltage from interconnect structures in first interconnect region 131. Metal contact structures 321 and 323 can include Cu, Al, TiN, TaN, W, or any other suitable conductive material.

In some embodiments of the present disclosure, the power supply voltage provided to device region 120 through backside interconnect structure 310 is different from a power supply voltage provided to other portions of semiconductor device 100. For example, the power supply voltage provided to active devices 322 in device region 120 can require a higher power supply voltage than that provided to other portions of device region 120. In some embodiments of the present disclosure, referring to FIGS. 1 and 3, the power supply voltage to device region 120 can be provided by backside interconnect region 310 and the power supply voltage to the other portions of device region 120 can be provided by a power supply source electrically connected to second interconnect region 132—which includes interconnect structures electrically connected to passive device region 133.

Referring to FIG. 3, active devices 322 can be other types of devices, such as MOSFETs, finFETs, nanostructure transistors (e.g., nanosheet transistors, nanowire transistors, multi-bridge channel transistors, and nano-ribbon transistors), and a combination thereof, according to some embodiments of the present disclosure. Active devices 322 be separated from one another using shallow trench isolation, deep trench isolation, local oxidation of silicon, other suitable isolation techniques, and a combination thereof. Further, although not shown in FIG. 3, device region 120 can also include passive devices (e.g., resistors, capacitors, and inductors).

In some embodiments of the present disclosure, first interconnect region 131 can include interconnect structures—e.g., metal line structures 331 and 332 and metal via structures 134 and 333—disposed in interlayer dielectric structure 334. Metal line structures 331 and 332 and metal via structures 134 and 333 can electrically connect to the active devices and/or the passive devices in device region 120 (e.g., active devices 322) such that these electrical components can electrically connect to one another and/or to upper interconnect structures (e.g., interconnect structures in second interconnect region 132 and in third interconnect region 136—not shown in FIG. 3). The metal line structures and metal via structures can include Cu, Al, TiN, TaN, W, or any other suitable conductive material. Interlayer dielectric structure 334 can include a dielectric material, such as $SiO_x$, SiOH, SiON, $SiN_x$, SiOC, SiOCN, and a combination thereof. Interlayer dielectric structure 334 can include a stack of dielectric layers to implement multiple layers of interconnect structures.

Figure 4:
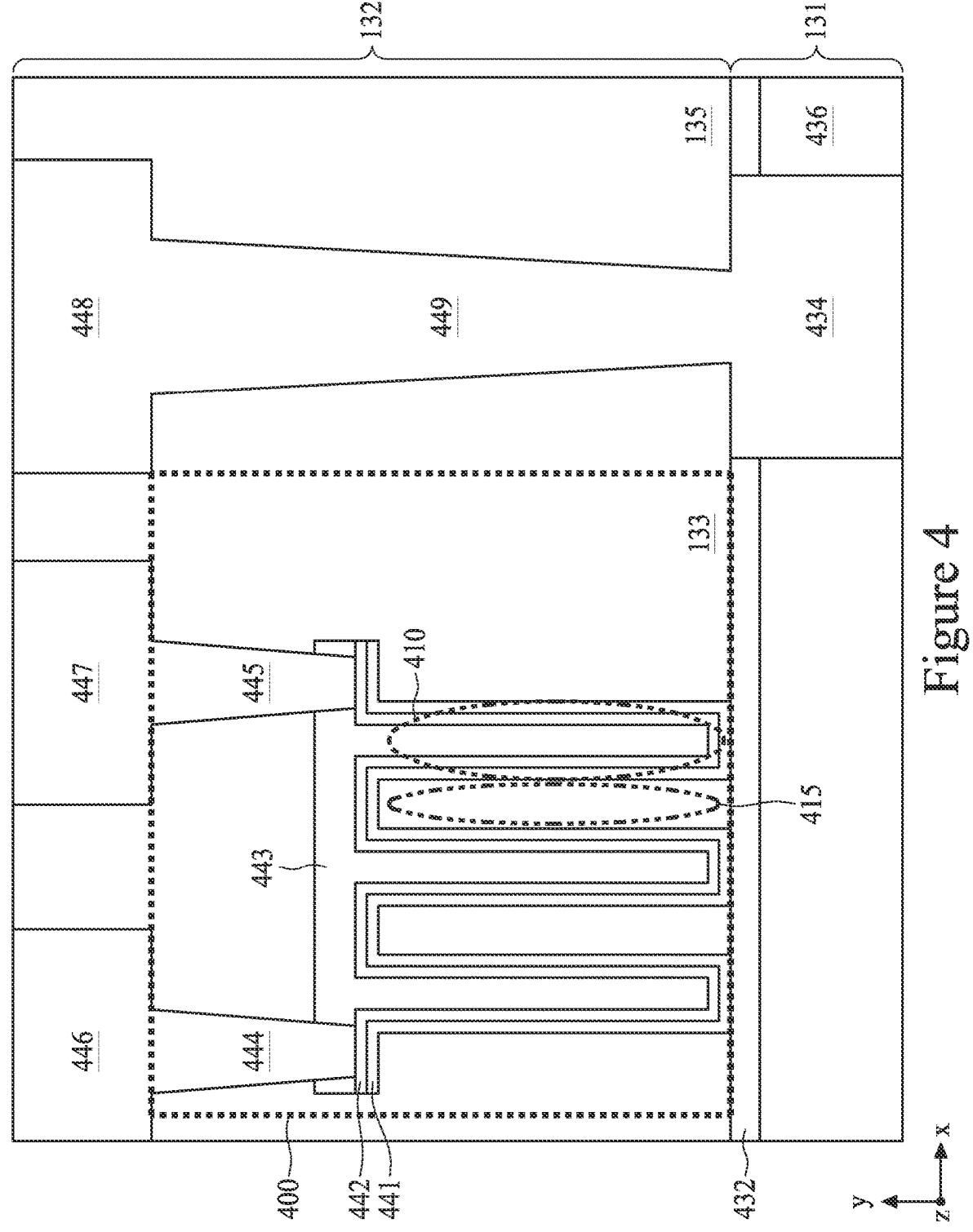
FIG. 4 is an illustration of a deep trench resistor formed in a back end of line region of a semiconductor device, according to some embodiments of the present disclosure.

FIG. 4 is an illustration of a cross-sectional view of a resistor structure 400 formed in passive device region 133 (of FIG. 1), according to some embodiments of the present disclosure. The cross-sectional view of FIG. 4 shows second interconnect region 132 disposed on first interconnect region 131. Although not shown in FIG. 4, device region 120 and substrate 110 are disposed below first interconnect region 131 (e.g., in a y direction), as shown in FIG. 1. Elements in FIG. 4 with the same annotations as elements in FIGS. 1-3 are described above.

Referring to FIG. 4, first interconnect region 131 includes an etch stop layer 432 and a metal line structure 434 disposed in an interlayer dielectric structure 436. Etch stop layer 432 can include a dielectric material, such as aluminum oxide ($Al_xO_y$), nitrogen doped silicon carbide (SiCN), oxygen doped silicon carbide (SiCO), and silicon nitride (SiN). Though not shown in FIG. 4, in addition to metal line structure 434, first interconnect region 131 can include other metal line structures and metal via structures—which can include can include Cu, Al, TiN, TaN, W, or any other suitable conductive material. Metal line structure 434 is electrically connected to one or more interconnect structures in second interconnect region 132 and to one or more active devices (e.g., planar MOSFETs, finFETs, GAAFETs, and nanostructure transistors) and/or passive devices (e.g., resistors, capacitors, and inductors) in device region 120 (of FIG. 1), according to some embodiments of the present disclosure.

Referring to FIG. 4, second interconnect region 132 includes metal line structures 446, 447, and 448, metal via structure 449, and resistor structure 400 (in passive device region 133) disposed in interlayer dielectric structure 135, according to some embodiments of the present disclosure. Interlayer dielectric structure 135 is disposed above electrical components—e.g., active devices (e.g., planar MOS-FETs, finFETs, GAAFETs, and nanostructure transistors), passive devices (e.g., resistors, capacitors, and inductors), or a combination thereof—in device region 120 (of FIG. 1), according to some embodiments of the present disclosure.

Metal line structure 448 and metal via structure 449 electrically connect other interconnect structures in second interconnect region 132 (and other interconnect structures above interconnect region 132—not shown in FIG. 4) to metal line structure 434 and other interconnect structures (not shown in FIG. 4) in first interconnect region 131. Metal line structures 446 and 447 are electrically connected to resistor structure 400 and electrically connect resistor structure 400 to one or more active devices (e.g., planar MOS-FETs, finFETs, GAAFETs, and nanostructure transistors) and/or passive devices (e.g., resistors, capacitors, and inductors) in device region 120 (of FIG. 1) through interconnect structures disposed in first interconnect region 131 (not shown in FIG. 4), according to some embodiments of the present disclosure. Though not shown in FIG. 4, in addition to metal line structures 446, 447, and 448 and metal via structure 449, second interconnect region 132 can include other metal line structures and metal via structures—which can include Cu, Al, TiN, TaN, W, or any other suitable conductive material.

In some embodiments of the present disclosure, resistor structure 400 in passive device region 133 is a deep trench resistor disposed in interlayer dielectric structure 135. Resistor structure 400 includes trenches 410, a metal layer 441, a semiconductor layer 442, an insulating layer 443, a first contact structure 444, and a second contact structure 445. Trenches 410 are disposed in interlayer dielectric structure 135 and separated from each other by a dielectric region 415 of interlayer dielectric structure 135. For example, resistor structure 400 includes three trenches 410 separated from each other by two dielectric regions 415. Though three trenches 410 are shown in FIG. 4, based on the description herein, more than or less than three trenches 410 can be implemented depending on a desired resistance value for resistor structure 400.

Metal layer 441 is disposed on a bottom surface and side surfaces of each of trenches 410 and on a top surface of dielectric region 415, according to some embodiments of the present disclosure. Metal layer 441 can include gold, platinum, chromium, titanium, tantalum, copper, silver, cobalt, nickel, iron, lead, aluminum, ruthenium, iridium, molybdenum, tungsten, or any other suitable material, according to some embodiments of the present disclosure. In some embodiments of the present disclosure, metal layer 441 can include ruthenium oxide, iridium oxide, titanium nitride, tantalum nitride, tungsten nitride, molybdenum nitride, titanium aluminum, titanium aluminum carbide, tantalum aluminum, tantalum aluminum carbide, titanium aluminum nitride, tantalum aluminum nitride, or any other suitable material.

Semiconductor layer 442 is disposed on a bottom surface, side surfaces, and a top surface of metal layer 441, according to some embodiments of the present disclosure. Semiconductor layer 442 can include silicon, germanium, silicon germanium, gallium nitride, indium nitride, indium gallium nitride, gallium arsenide, indium arsenide, indium gallium arsenide, indium gallium zinc oxide, copper oxide, indium zinc oxide, gallium zinc oxide, or any other suitable material. In some embodiments of the present disclosure, semiconductor layer 442 can include silicon germanium doped with boron or phosphorous or other doped materials.

In some embodiments of the present disclosure, metal layer 441 can be a substantially conformal layer disposed on the bottom surface and side surfaces of each of trenches 410. Semiconductor layer 442 can be a substantially conformal layer—separate from the substantially conformal metal layer 441—disposed on the bottom surface, side surfaces, and the top surface of metal layer 441. A ratio of a thickness of semiconductor layer 442 to a thickness of metal layer 441 can be between about 0.1 and about 0.5, according to some embodiments of the present disclosure. In maintaining the ratio between about 0.1 and about 0.5, a temperature coefficient of resistance for resistor structure 400 approaches zero, according to some embodiments of the present disclosure. The temperature coefficient of resistance is a calculation of relative change in resistance per degree of temperature change, where a temperature coefficient of resistance of about zero indicates a small change in resistance (if any) over a temperature range. Though resistor structure 400 has a single layer of semiconductor layer 442 disposed on a single layer of metal layer 441 to form a single metal/semiconductor bi-layer, resistor structure 400 can have multiple metal/semiconductor bi-layers to adjust the temperature coefficient of resistance to a desired value (e.g., a value that approaches zero).

Insulating layer 443 is disposed in trenches 410 and is in contact with side surfaces of semiconductor layer 442 and a top surface of semiconductor layer 442, according to some embodiments of the present disclosure. In some embodiments of the present disclosure, insulating layer 443 can include a dielectric material, such as $Al_xO_y$, SiCN, SiCO, and SiN.

First contact structure 444 is in contact with a portion of semiconductor layer 442 disposed over a first portion of interlayer dielectric layer structure 135 opposite to dielectric region 415 that separates adjacent trenches. Similarly, second contact structure 445 is in contact with another portion of semiconductor layer 442 disposed over a second portion of interlayer dielectric structure 135 opposite to another dielectric region 415 that separates adjacent trenches. In some embodiments of the present disclosure, first contact structure 444 and second contact structure 445 are in contact with terminals of resistor structure 400—e.g., a current flowing through resistor structure 400 can flow from first contact structure 444 to second contact structure 445—or vice versa.

Again, referring to FIGS. 1 and 4, a benefit of implementing resistor structure 400 in passive device region 133 is that back end of line region 130 can be utilized for the fabrication of passive devices—e.g., resistor structure 400—thus increasing available area in device region 120 for the implementation of additional active devices and/or passive devices to enhance the functionality and performance of semiconductor device 100.

Figure 5:
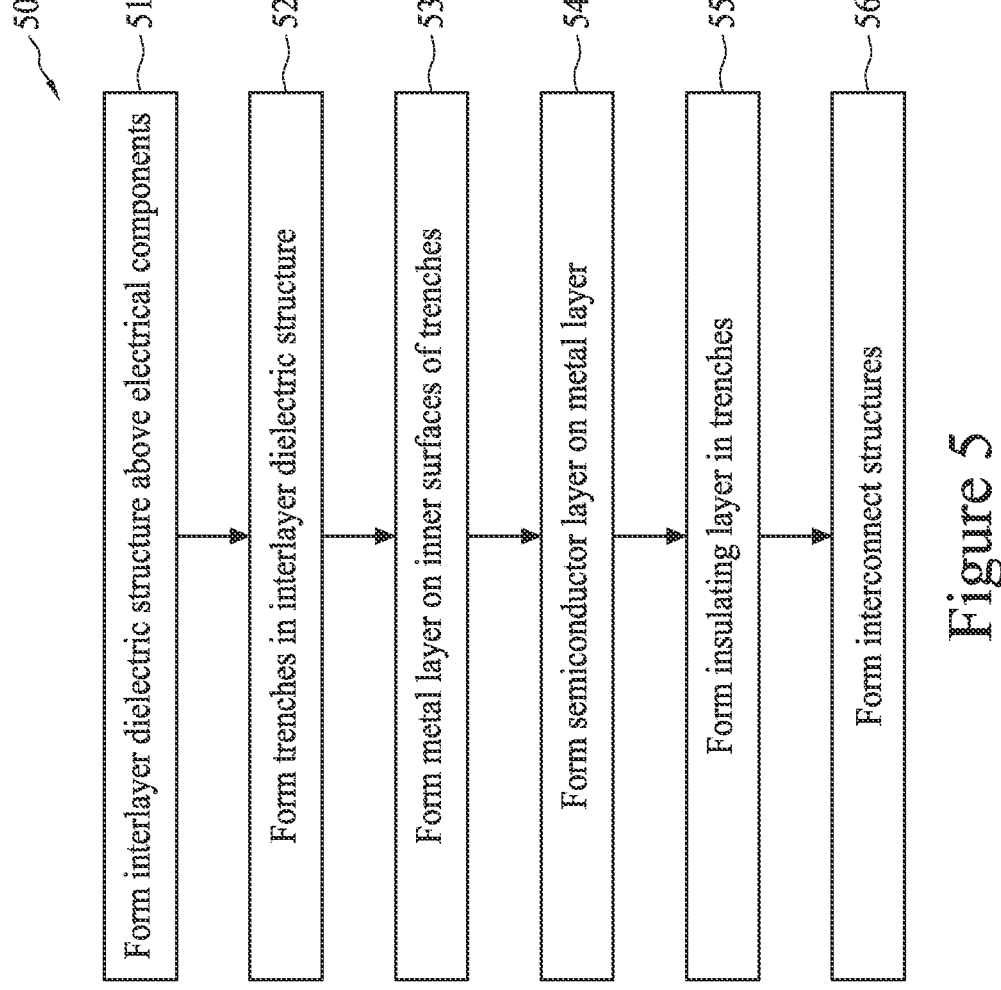
FIG. 5 is an illustration of a method to form a resistor structure in a back end of line region of a semiconductor device, according to some embodiments of the present disclosure.

FIG. 5 is an illustration of a method 500 to form resistor structure 400 in a back end of line region 130 of semiconductor device 100, according to some embodiments of the present disclosure. For illustrative purposes, the operations of method 500 will be described with reference to FIGS. 6A-14A and 6B-14B. FIGS. 6A-14A are top-level views and FIGS. 6B-14B are cross-sectional views of resistor structure 400 at various stages of fabrication, according to some embodiments of the present disclosure. The operations of method 500 can be performed in a different order or not performed depending on specific applications. It should be noted that method 500 may not produce a complete semiconductor device. Accordingly, it is understood that additional operations can be provided before, during, and after method 500, and that some other processes may only be briefly described herein. Elements in FIGS. 6A-14A and 6B-14B with the same annotations as elements in FIGS. 1-4 are described above.

Figure 6B:
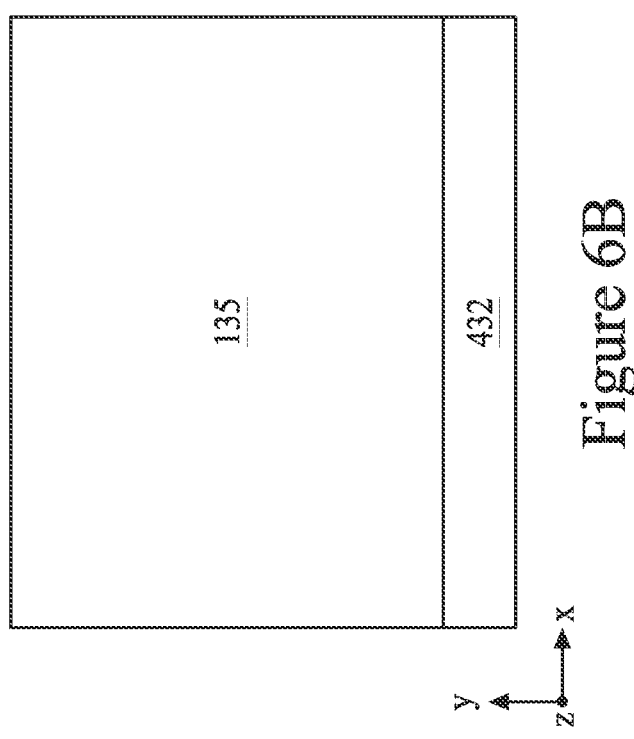
Figure 6A:
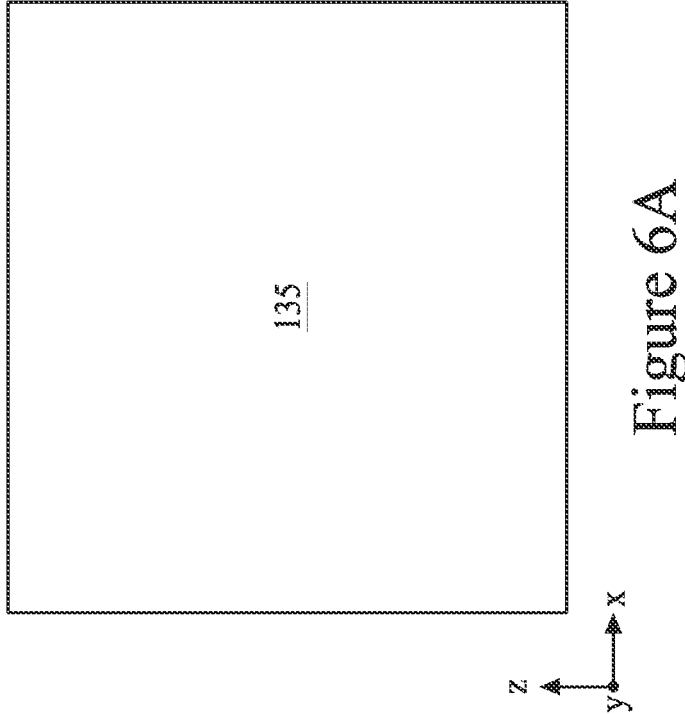

Referring to FIG. 5, at operation 510, an interlayer dielectric structure is formed above electrical components on a substrate. Referring to FIGS. 6A and 6B, interlayer dielectric structure 135 is formed above electrical components on the substrate. For example, referring to FIGS. 1 and 4, etch stop layer 432 is a portion of first interconnect region 131, which is disposed above device region 120. Device region 120 can include electrical components, such as active devices (e.g., planar MOSFETs, finFETs, GAAFETs, and nanostructure transistors), passive devices (e.g., resistors, capacitors, and inductors), or a combination thereof. In some embodiments of the present disclosure, a combination of the active devices and the passive devices can form one or more electronic circuits, such as a central processing unit, a graphics processing unit, an application-specific integrated circuit, any other suitable electronic circuit, and portions thereof. Device region 120 is disposed on substrate 110.

Further, prior to the formation of interlayer dielectric structure 135 in FIGS. 6A and 6B, the active devices and/or passive devices in device region 120 and interconnect structures in first interconnect region 131 are formed, according to some embodiments of the present disclosure.

Figure 7B:
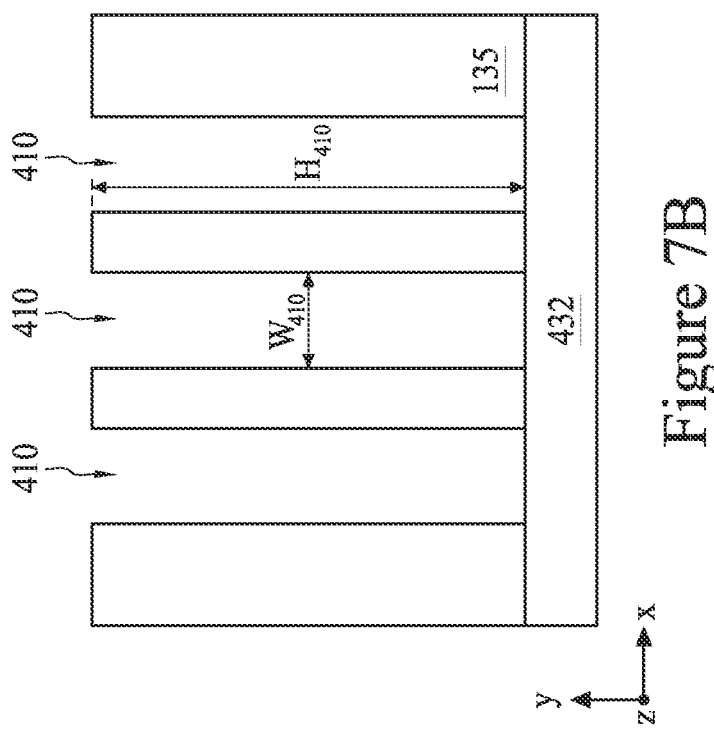
Figure 7A:
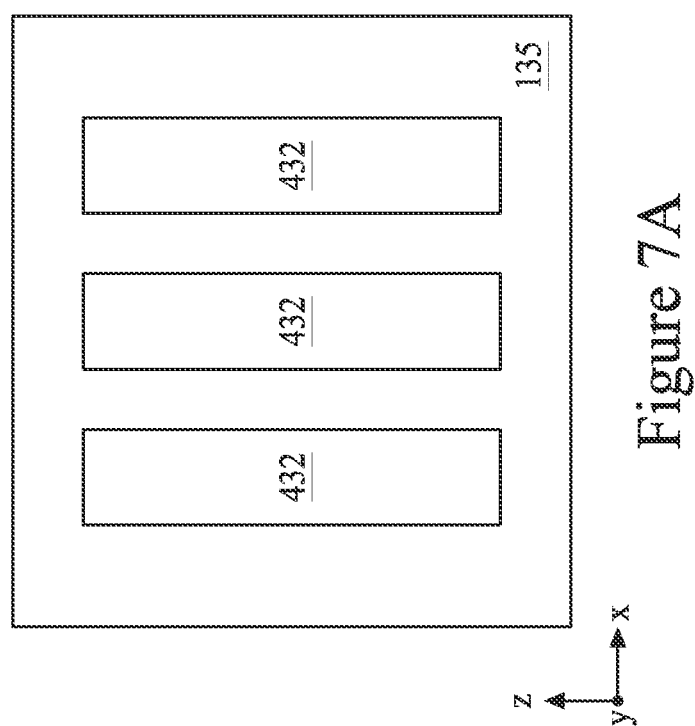

Referring to FIG. 5, at operation 520, trenches are formed in the interlayer dielectric structure, where the trenches are separated from each other by a dielectric region on the interlayer dielectric structure. Referring to FIGS. 7A and 7B, trenches 410 are formed in interlayer dielectric structure 135 by, for example, a photo pattern and etch process. In some embodiments of the present disclosure, height $H_{410}$ of each trench 410 (e.g., in a y direction) can be substantially equal to or less than a height of interlayer dielectric structure 135. For example, height $H_{410}$ (or depth) can be between about 0.25 μm and about 3 μm—where the height of interlayer dielectric structure can be about 3 μm. In some embodiments of the present disclosure, a width $W_{410}$ of each trench (e.g., in a x direction) can be between about 50 nm and about 250 nm. Further, though three trenches 410 are shown in FIGS. 7A and 7B, based on the description herein, more than or less than three trenches 410 can be implemented depending on a desired resistance value for resistor structure 400.

Figure 8B:
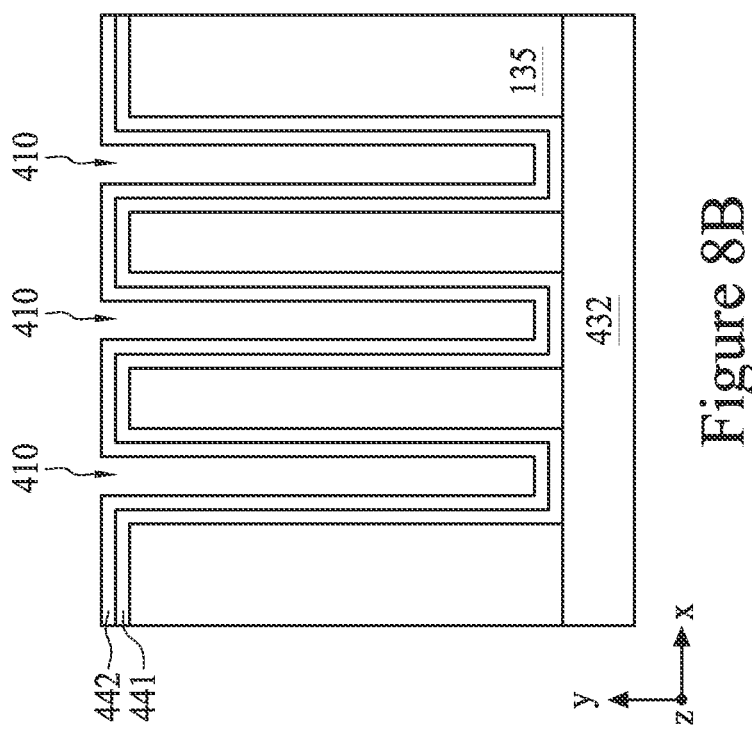
Figure 8A:
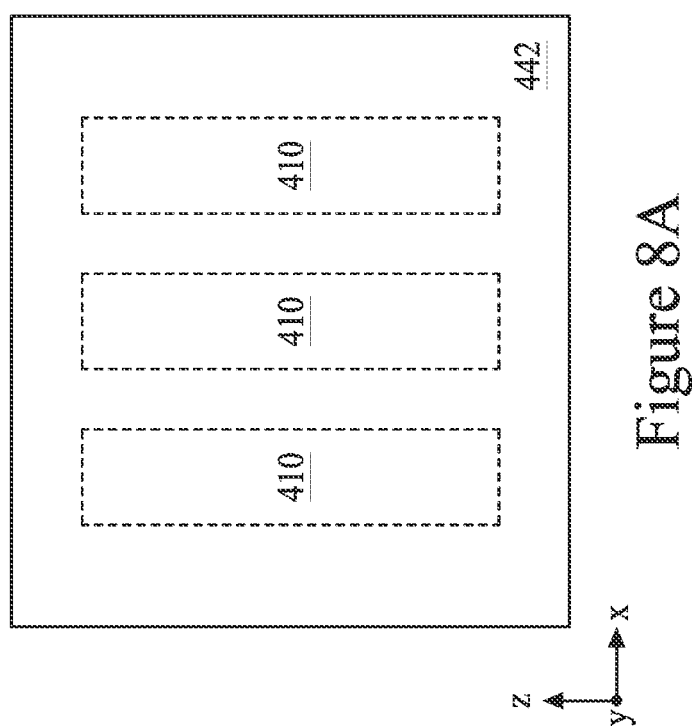

Referring to FIG. 5, at operation 530, a metal layer is formed on a bottom surface and side surfaces of each of the trenches and on a top surface of the dielectric region. Referring to FIGS. 8A and 8B, metal layer 441 is formed on a bottom surface and side surfaces of each of trenches 410 by, for example, a chemical vapor deposition process, an atomic layer deposition process, or any other suitable deposition process. In some embodiments of the present disclosure, metal layer 441 can be a substantially conformal layer with a thickness between about 5 nm and about 50 nm. Metal layer 441 can include gold, platinum, chromium, titanium, tantalum, copper, silver, cobalt, nickel, iron, lead, aluminum, ruthenium, iridium, molybdenum, tungsten, or any other suitable material, according to some embodiments of the present disclosure. In some embodiments of the present disclosure, metal layer 441 can include ruthenium oxide, iridium oxide, titanium nitride, tantalum nitride, tungsten nitride, molybdenum nitride, titanium aluminum, titanium aluminum carbide, tantalum aluminum, tantalum aluminum carbide, titanium aluminum nitride, tantalum aluminum nitride, or any other suitable material.

Referring to FIG. 5, at operation 540, a semiconductor layer is formed on a bottom surface, side surfaces, and a top surface of the metal layer. Referring to FIGS. 8A and 8B, semiconductor layer 442 is formed on a bottom surface, side surfaces, and a top surface of metal layer 441 by, for example, a chemical vapor deposition process, an atomic layer deposition process, or any other suitable deposition process. In some embodiments of the present disclosure, semiconductor layer 442 can be a substantially conformal layer with a thickness between about 2 nm and about 10 nm. Semiconductor layer 442 can include silicon, germanium, silicon germanium, gallium nitride, indium nitride, indium gallium nitride, gallium arsenide, indium arsenide, indium gallium arsenide, indium gallium zinc oxide, copper oxide, indium zinc oxide, gallium zinc oxide, or any other suitable material. In some embodiments of the present disclosure, semiconductor layer 442 can include silicon germanium doped with boron or phosphorous or other doped materials.

Semiconductor layer 442 and metal layer 441 can both be substantially conformal layers with different thicknesses, where a ratio of a thickness of semiconductor layer 442 to a thickness of metal layer 441 can be between about 0.1 and about 0.5, according to some embodiments of the present disclosure. In maintaining the ratio between about 0.1 and about 0.5, a temperature coefficient of resistance for resistor structure 400 approaches zero, according to some embodiments of the present disclosure. Though resistor structure 400 has a single layer of semiconductor layer 442 disposed on a single layer of metal layer 441 to form a single metal/semiconductor bi-layer, resistor structure 400 can have multiple metal/semiconductor bi-layers-formed by multiple iterations of operations 530 and 540—to adjust the temperature coefficient of resistance to a desired value (e.g., a value that approaches zero).

Figure 9B:
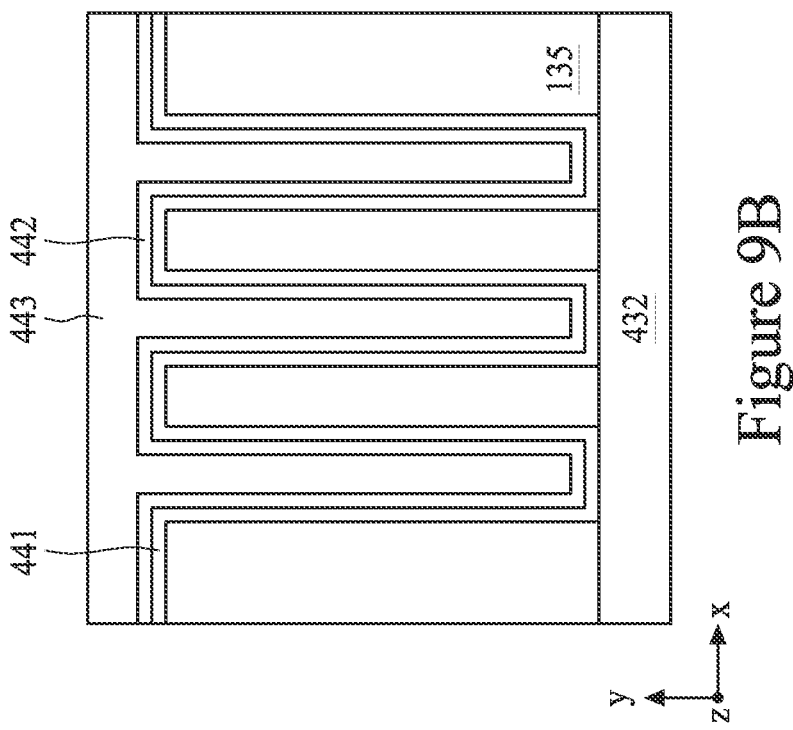
Figure 9A:
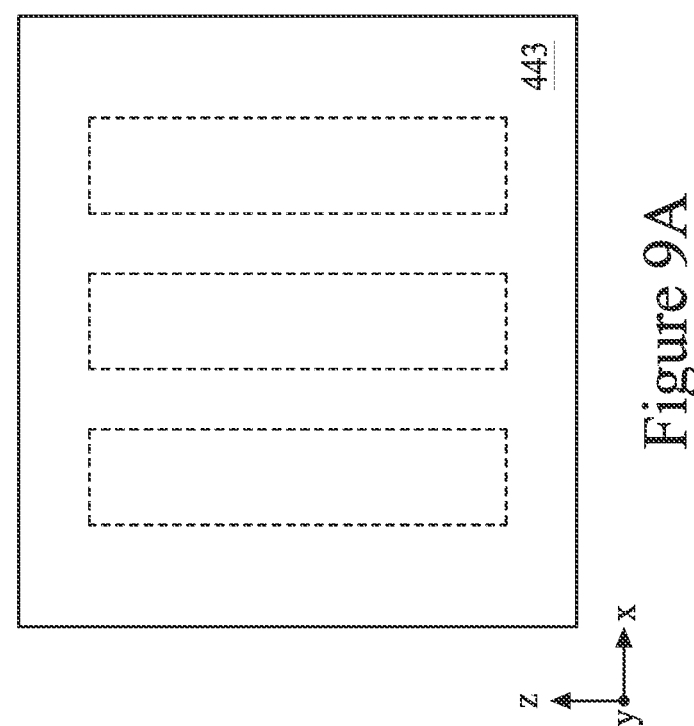

Referring to FIG. 5, at operation 550, an insulating layer is formed in the trenches and is in contact with side surfaces of the semiconductor layer and a top surface of the semiconductor layer. Referring to FIGS. 9A and 9B, insulating layer 443 is formed in trenches 410 and is in contact with side surfaces of semiconductor layer 442 and a top surface of semiconductor layer 442 by, for example, a chemical vapor deposition process, an atomic layer deposition process, or any other suitable deposition process. In some embodiments of the present disclosure, insulating layer 443 can include a dielectric material, such as $Al_xO_y$, SiCN, SiCO, and SiN.

Figure 10B:
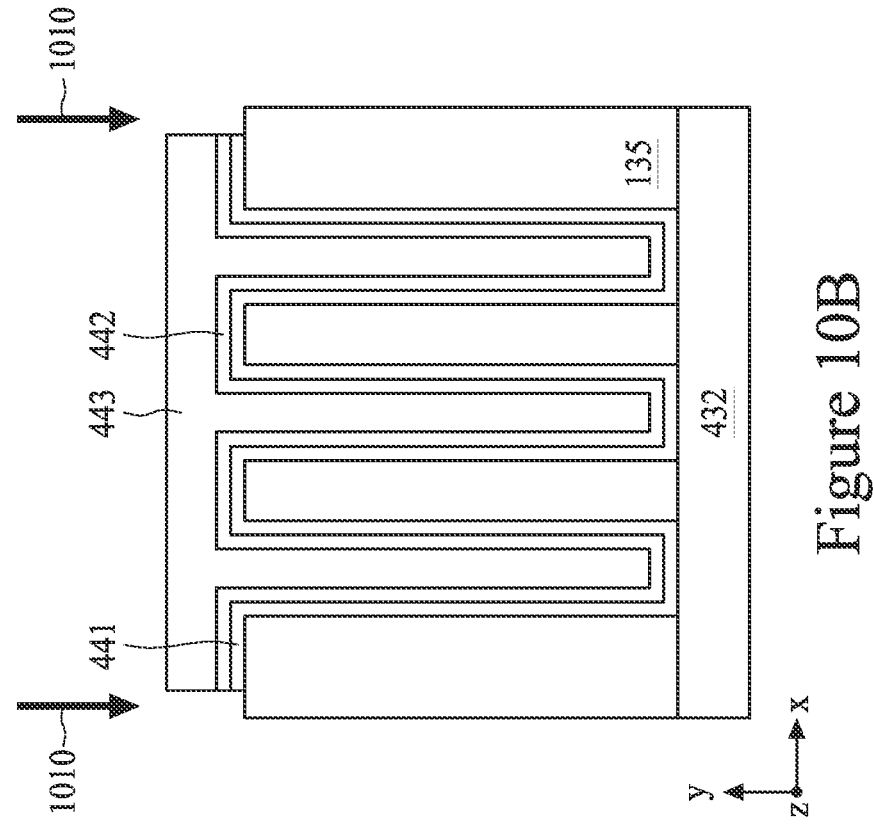
Figure 10A:
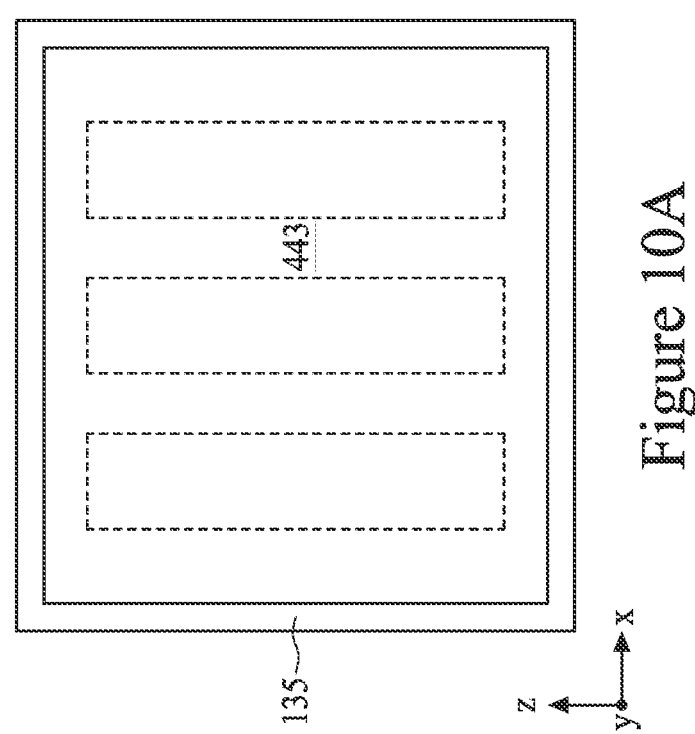
Figure 11B:
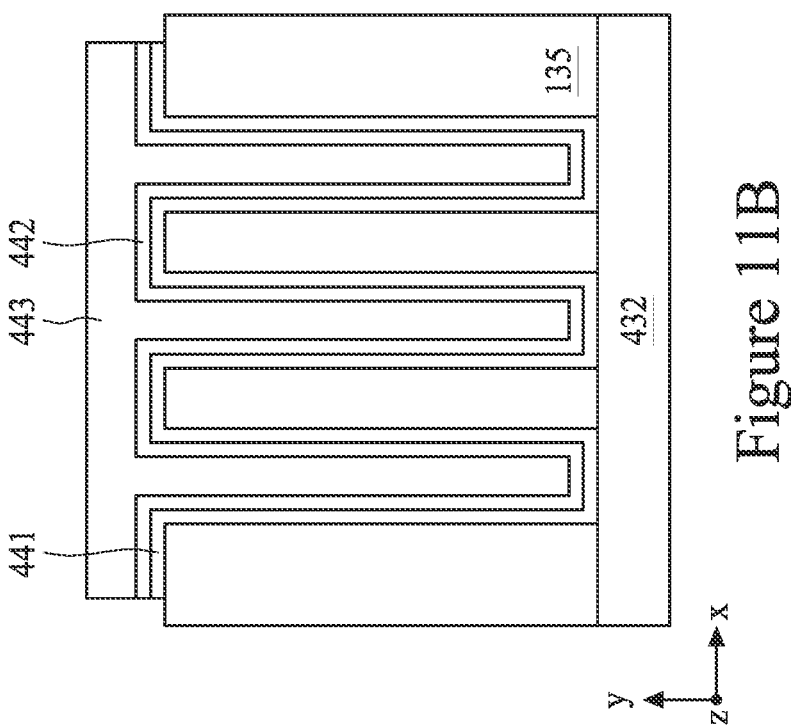
Figure 11A:
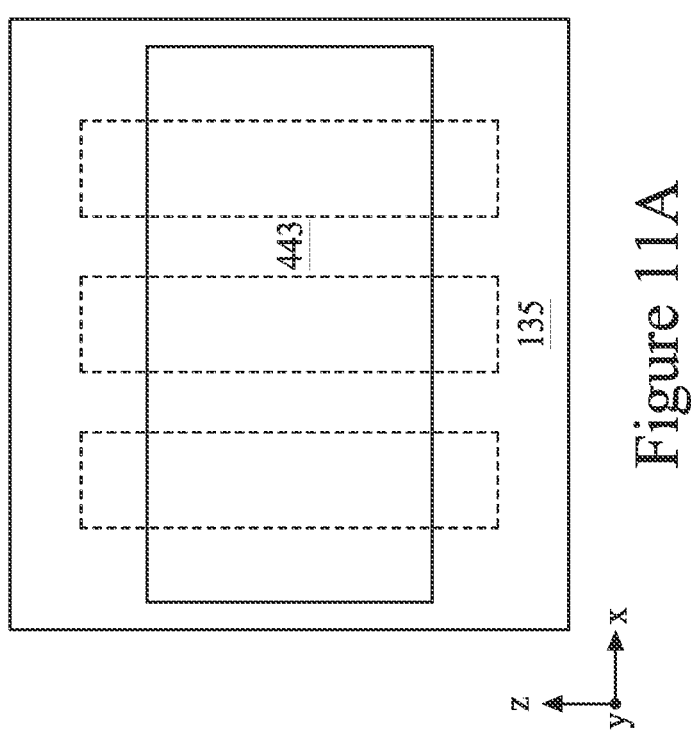

Insulating layer 443 can be photo patterned and etched, according to some embodiments of the present disclosure. Referring to FIGS. 10A and 10B, insulating layer 443 can be undergo a photo patterning and etching process 1010 to expose interlayer dielectric structure 135 along a periphery of insulating layer 443. In some embodiments of the present disclosure, insulating layer 443 can be further photo patterned and etched to form trench end cuts (e.g., to prevent electrical shorts within resistor structure 400). Referring to FIGS. 11A and 11B, insulating layer 443 can undergo another photo patterning and etching process to remove additional portions of insulating layer 443 (e.g., in a z direction).

Figure 12B:
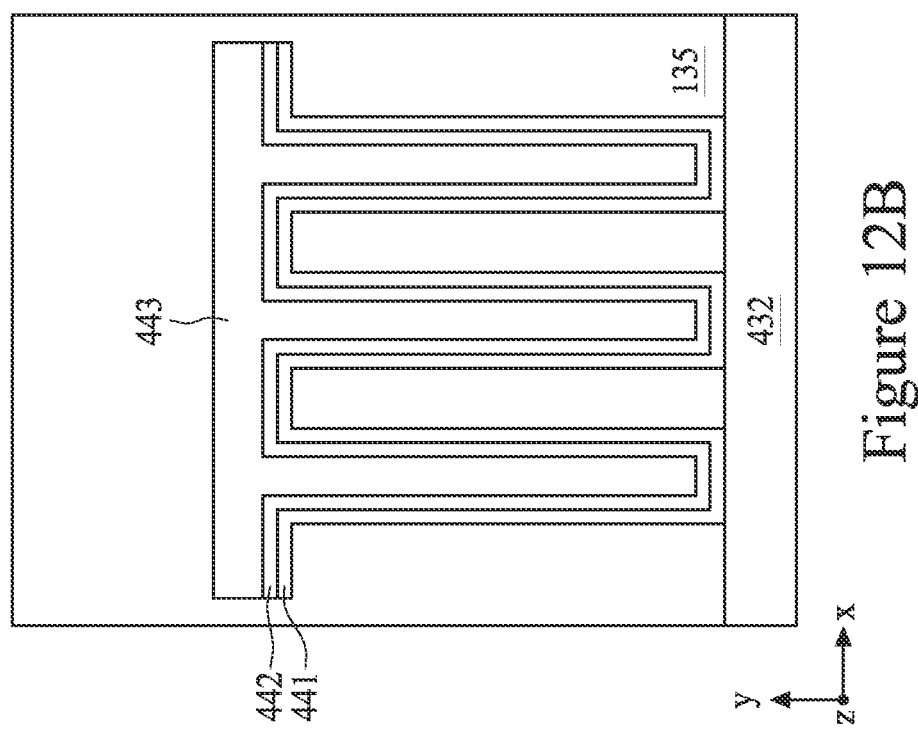
Figure 12A:
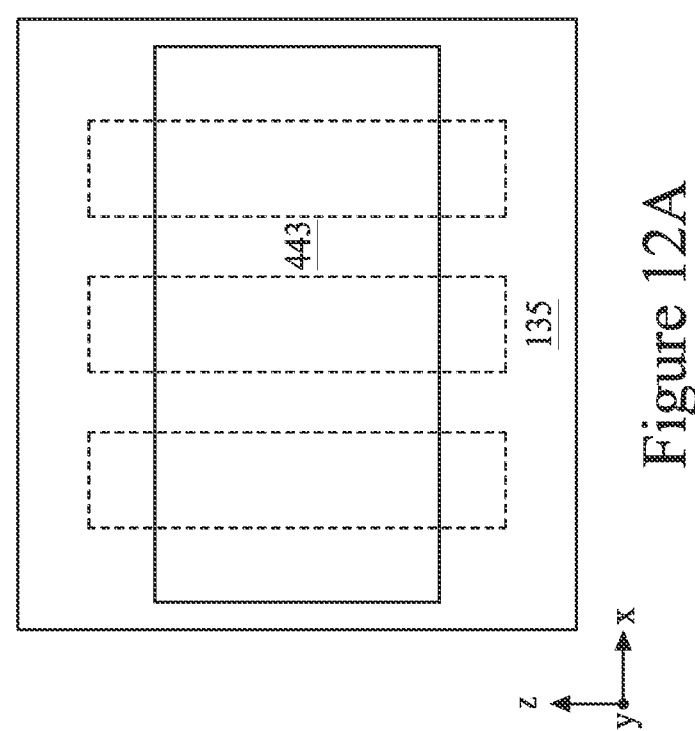
Figures 13A, 13B:
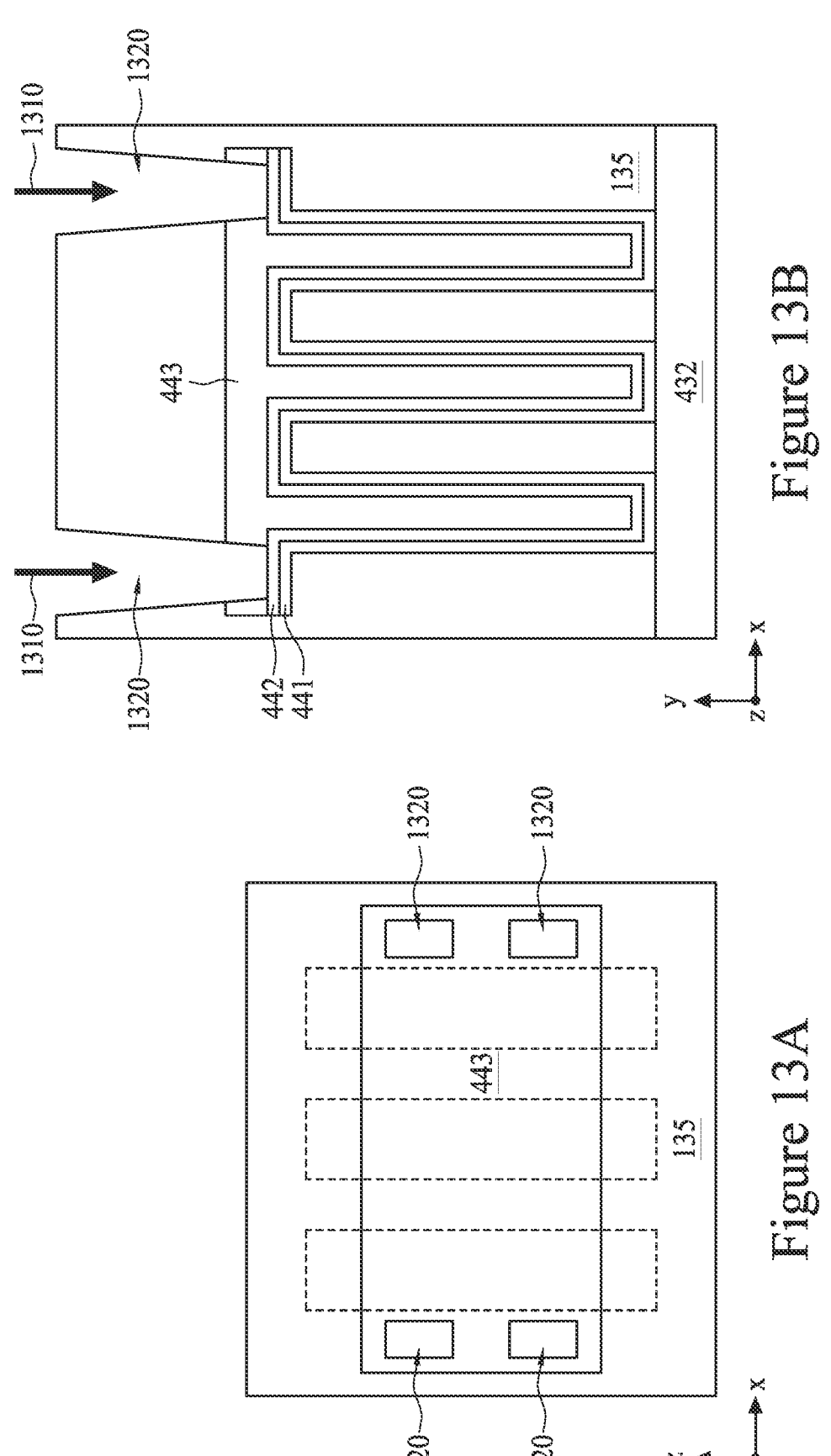

Referring to FIG. 5, at operation 560, interconnect structures are formed in the interlayer dielectric structure. Referring to FIGS. 12A and 12B, the formation of the interconnect structures can include depositing a dielectric material (e.g., $SiN_x$, SiOC, and SiOCN) onto the semiconductor structure of FIGS. 11A and 11B and performing a polishing operation (e.g., a chemical mechanical polishing operation). The dielectric material can be the same material as interlayer dielectric structure 135. Referring to FIGS. 13A and 13B, the formation of the interconnect structures can also include performing a photo patterning and etching process 1310 to form contact openings 1320. Contact openings 1320 are formed through interlayer dielectric structure 135 and insulating layer 443 so that portions of semiconductor layer 442 are exposed. Further, referring to FIGS. 14A and 14B, a conductive material (e.g., Cu, Al, TiN, TaN, and W) is deposited into contact openings 1320 and polished (e.g., chemical mechanical polishing) to form first contact structure 444 and second contact structure 445.

Figures 14A, 14B:
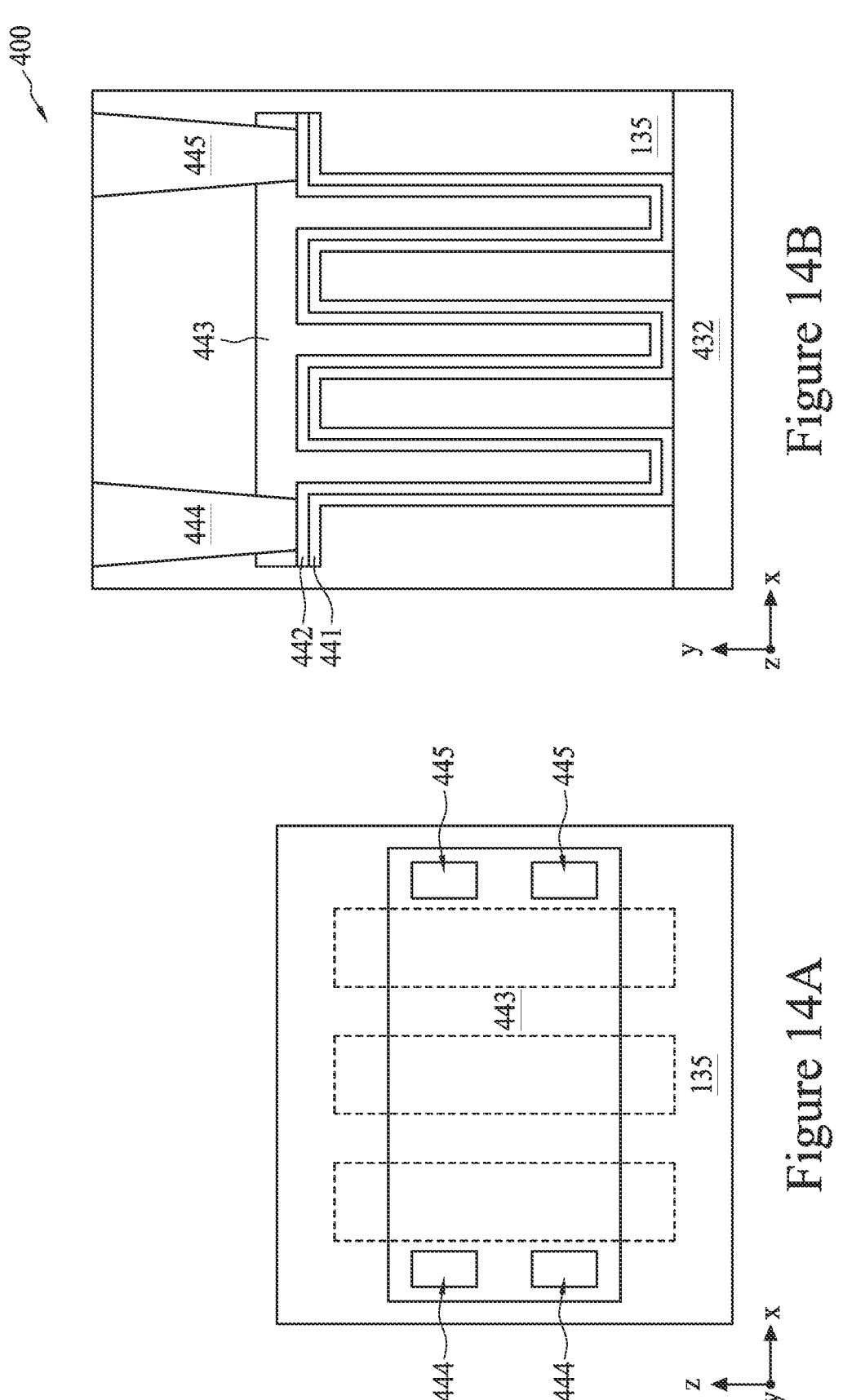

First contact structure 444 is in contact with a portion of semiconductor layer 442 disposed over a portion of interlayer dielectric structure 135 at an end of resistor structure 400. Second contact structure 445 is in contact with another portion of semiconductor layer 442 disposed over another portion of interlayer dielectric structure at an opposite end of resistor structure 400. First contact structure 444 and second contact structure 445 can electrically connect to other interconnect structures, such as metal line structures 446 and 447 in FIG. 4. Although four contact structures are shown in FIGS. 14A and 14B, resistor structure 400 can have more or less than four contact structures depending on the design on resistor structure 400.

With advances in semiconductor technology, there have been increasing demands for higher storage capacity, faster processing systems, higher performance, and lower costs. To meet these demands, the semiconductor industry continues to scale down the dimensions of circuit elements, such as active devices (e.g., MOSFETs, finFETs, and GAAFETs) and passive devices (e.g., capacitors, inductors, and resistors). As the number of circuit elements increases, implementation of these circuit elements becomes increasingly more complex.

The present disclosure describes semiconductor structures and methods to form resistor structures (e.g., resistor structure 400 of FIG. 4) in a back end of line region of a semiconductor device (e.g., back end of line region 130 of semiconductor device 100 in FIG. 1). The resistor structure can include a dielectric layer, trenches, a metal layer, a semiconductor layer, and an insulating layer. The dielectric layer is disposed above electrical components formed on a substrate. The trenches are disposed in the dielectric layer and separated from each other by a dielectric region of the dielectric layer. The metal layer is disposed on a bottom surface and side surfaces of each of the trenches and on a top surface of the dielectric region. The semiconductor layer is disposed on a bottom surface, side surfaces, and a top surface of the metal layer. The insulating layer disposed in the plurality of trenches and in contact with side surfaces of the semiconductor layer and on a top surface of the semiconductor layer. A benefit, among others, of implementing the resistor structure in the back end of line region of the semiconductor device is that that the back end of line region can be utilized for the fabrication of passive devices—e.g., resistor structures—thus increasing available area on the substrate for the implementation of additional active devices and/or passive devices to enhance the functionality and performance of the semiconductor device.

Embodiments of the present disclosure include a resistor structure with a dielectric layer, trenches, a metal layer, a semiconductor layer, and an insulating layer. The dielectric layer is disposed above electrical components formed on a substrate. The trenches are disposed in the dielectric layer and separated from each other by a dielectric region of the dielectric layer. The metal layer is disposed on a bottom surface and side surfaces of each of the trenches and on a top surface of the dielectric region. The semiconductor layer is disposed on a bottom surface, side surfaces, and a top surface of the metal layer. The insulating layer disposed in the trenches and in contact with side surfaces of the semiconductor layer and a top surface of the semiconductor layer.

Embodiments of the present disclosure include a semiconductor structure with a substrate and a metal region. The substrate includes electrical components formed thereon. The metal region is disposed over the electrical components and includes a dielectric layer, interconnect structures disposed in the dielectric layer, and a resistor structure disposed in the dielectric layer and in contact with the interconnect structures. The resistor structure includes trenches, a metal layer, a semiconductor layer, and an insulating layer. The trenches are separated from each other by a dielectric region of the dielectric layer. The metal layer is disposed on a bottom surface and side surfaces of each of the trenches and on a top surface of the dielectric region. The semiconductor layer is disposed on a bottom surface, side surfaces, and a top surface of the metal layer. The insulating layer disposed in the trenches and in contact with side surfaces of the semiconductor layer and a top surface of the semiconductor layer.

Embodiments of the present disclosure include a method to form a resistor structure in a back end of line region of a semiconductor device. The method includes forming a dielectric layer above electrical components disposed on a substrate; forming, in the dielectric layer, trenches separated from each other by a dielectric region of the dielectric layer; forming a metal layer on a bottom surface and side surfaces of each of the trenches and on a top surface of the dielectric region; forming a semiconductor layer on a bottom surface, side surfaces, and a top surface of the metal layer; and forming an insulating layer in the trenches and in contact with side surfaces of the semiconductor layer and a top surface of the semiconductor layer.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A resistor structure, comprising:
a dielectric layer disposed above a plurality of electrical components formed on a substrate;
a plurality of trenches disposed in the dielectric layer and separated from each other by a dielectric region of the dielectric layer;
a metal layer disposed on a bottom surface and side surfaces of each of the plurality of trenches and on a top surface of the dielectric region;
a semiconductor layer disposed on a bottom surface, side surfaces, and a top surface of the metal layer; and
an insulating layer disposed in the plurality of trenches and in contact with side surfaces of the semiconductor layer and a top surface of the semiconductor layer.

2. The resistor structure of claim 1, further comprising:
a first contact structure in contact with a portion of the semiconductor layer disposed over a first portion of the dielectric layer and opposite to the dielectric region; and
a second contact structure in contact with another portion of the semiconductor layer disposed over a second portion of the dielectric layer and opposite to another dielectric region that separates adjacent trenches of the plurality of trenches.

3. The resistor structure of claim 1, wherein a width of each trench of the plurality of trenches is between about 50 nm and about 250 nm.

4. The resistor structure of claim 1, wherein a height of each of the plurality of trenches is between about 250 nm and about 3,000 nm.

5. The resistor structure of claim 1, wherein the metal layer comprises gold, platinum, chromium, titanium, tantalum, copper, silver, cobalt, nickel, iron, lead, aluminum, ruthenium, iridium, molybdenum, or tungsten.

6. The resistor structure of claim 1, wherein the metal layer comprises ruthenium oxide, iridium oxide, titanium nitride, tantalum nitride, tungsten nitride, molybdenum nitride, titanium aluminum, titanium aluminum carbide, tantalum aluminum, tantalum aluminum carbide, titanium aluminum nitride, or tantalum aluminum nitride.

7. The resistor structure of claim 1, wherein the semiconductor layer comprises silicon, germanium, silicon germanium, gallium nitride, indium nitride, indium gallium nitride, gallium arsenide, indium arsenide, indium gallium arsenide, indium gallium zinc oxide, copper oxide, indium zinc oxide, or gallium zinc oxide.

8. The resistor structure of claim 1, wherein the semiconductor layer comprises silicon germanium doped with boron or phosphorous.

9. The resistor structure of claim 1, wherein a ratio of a thickness of the semiconductor layer to a thickness of the metal layer is between about 0.1 and about 0.5.

10. A semiconductor structure, comprising:
a substrate with a plurality of electrical components formed thereon; and
a metal region disposed over the plurality of electrical components, wherein the metal region comprises:
a dielectric layer;
a plurality of interconnect structures disposed in the dielectric layer; and
a resistor structure disposed in the dielectric layer and in contact with the plurality of interconnect structures, wherein the resistor structure comprises:
a plurality of trenches separated from each other by a dielectric region of the dielectric layer;
a metal layer disposed on a bottom surface and side surfaces of each of the plurality of trenches and on a top surface of the dielectric region;
a semiconductor layer disposed on a bottom surface, side surfaces, and a top surface of the metal layer; and
an insulating layer disposed in the plurality of trenches and in contact with side surfaces of the semiconductor layer and a top surface of the semiconductor layer.

11. The semiconductor structure of claim 10, wherein at least one of the plurality of electrical components is electrically connected to the resistor structure.

12. The semiconductor structure of claim 10, wherein the plurality of interconnect structures comprise:
a first contact structure in contact with a portion of the semiconductor layer disposed over a first portion of the dielectric layer and opposite to the dielectric region; and
a second contact structure in contact with another portion of the semiconductor layer disposed over a second portion of the dielectric layer and opposite to another dielectric region that separates adjacent trenches of the plurality of trenches.

13. The semiconductor structure of claim 10, wherein a width of each trench of the plurality of trenches is between about 50 nm and about 250 nm.

14. The semiconductor structure of claim 10, wherein a height of each of the plurality of trenches is between about 250 nm and about 3,000 nm.

15. The semiconductor structure of claim 10, wherein a ratio of a thickness of the semiconductor layer to a thickness of the metal layer is between about 0.1 and about 0.5.

16. A method, comprising:

forming a dielectric layer above a plurality of electrical components disposed on a substrate;

forming, in the dielectric layer, a plurality of trenches separated from each other by a dielectric region of the dielectric layer;

depositing a metal layer on a bottom surface and side surfaces of each of the plurality of trenches and on a top surface of the dielectric region;

depositing a semiconductor layer on a bottom surface, side surfaces, and a top surface of the metal layer; and depositing an insulating layer in the plurality of trenches and in contact with side surfaces of the semiconductor layer and a top surface of the semiconductor layer.

17. The method of claim 16, further comprising:

forming a plurality of interconnect structures in the dielectric layer.

18. The method of claim 17, wherein forming the plurality of interconnect structures comprises:

forming a first contact structure in contact with a portion of the semiconductor layer disposed over a first portion of the dielectric layer and opposite to the dielectric region; and forming a second contact structure in contact with another portion of the semiconductor layer disposed over a second portion of the dielectric layer and opposite to the dielectric region.

19. The method of claim 16, wherein forming the plurality of trenches comprises:

forming each of the plurality of trenches with a width between about 50 nm and about 250 nm; and forming each of the plurality of trenches with a height between about 250 nm and about 3,000 nm.

20. The method of claim 16, depositing the metal layer and depositing the semiconductor layer comprise:

forming the metal layer with a first thickness; and forming the semiconductor layer with a second thickness different from the first thickness, wherein a ratio of the second thickness to the first thickness in between about 0.1 and about 0.5.

\* \* \* \* \*